United States Patent
Suto

(10) Patent No.: US 6,957,407 B2
(45) Date of Patent: Oct. 18, 2005

(54) METHOD AND APPARATUS FOR DETAIL ROUTING USING OBSTACLE CARVING AROUND TERMINALS

(75) Inventor: Gyorgy Suto, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 465 days.

(21) Appl. No.: 10/206,742

(22) Filed: Jul. 26, 2002

(65) Prior Publication Data

US 2003/0009736 A1 Jan. 9, 2003

Related U.S. Application Data

(62) Division of application No. 09/473,915, filed on Dec. 28, 1999, now Pat. No. 6,446,246.

(51) Int. Cl.[7] .............................................. G06F 17/50
(52) U.S. Cl. .............................. 716/10; 716/1; 716/11; 716/12; 716/15
(58) Field of Search .................................. 716/1, 10, 11, 716/12, 15, 2, 13, 14

(56) References Cited

U.S. PATENT DOCUMENTS 6,301,686 B1 * 10/2001 Kikuchi et al. ................ 716/2

* cited by examiner

*Primary Examiner*—Thuan Do
(74) *Attorney, Agent, or Firm*—Cynthia T. Faatz

(57) ABSTRACT

Detail routing using obstacle carving around terminals. A terminal in an integrated circuit layout object that is separated from an obstacle by less than a spacing specified by a design rule is identified. The obstacle is carved to reduce an area of the obstacle by an overlap between the obstacle and the terminal bloated by the spacing.

13 Claims, 9 Drawing Sheets

US 6,957,407 B2

1

METHOD AND APPARATUS FOR DETAIL ROUTING USING OBSTACLE CARVING AROUND TERMINALS

CROSS-REFERENCE TO RELATED APPLICATIONS

The present application is a divisional of U.S. patent application Ser. No. 09/473,915 of the same title filed Dec. 28, 1999 now U.S. Pat. No. 6,446,246 and assigned to the same assignee and claims priority thereto.

BACKGROUND

1. Field

An embodiment of the present invention relates to the field of computer-aided design and, more particularly, to routing for integrated circuit designs.

2. Discussion of Related Art

The physical design process for most integrated circuit chips typically includes floorplanning, global routing and detail routing processes, each of which may be performed multiple times. During floorplanning, functional unit or other types of blocks may be placed within a model of the chip. The floorplanning process is followed by a global routing process during which nets or wires between the blocks and their corresponding terminals are placed within the model for purposes of timing and other cost estimations and to roughly estimate their final placement in the integrated circuit layout. Detail routing follows global routing and determines the actual placement of wires between and within integrated circuit blocks in the layout and associated terminals and vias.

Most currently available detail routers typically fall into one of two categories: design rule-correct routers or design-rule incorrect routers. Design rule-correct routers only route a wire if it can be done without violating any design rules. Where such a router determines that a wire cannot be routed without violating a design rule, the router will not complete the routing process. In contrast, design rule-incorrect routers typically complete the routing process, but may create new design rule violations in so doing. Where a wire cannot be routed without creating a new design rule violation, the design-rule incorrect router will route the wire, but may do so in an undesirable manner.

Referring to FIG. 1, in a typical very large scale integration (VLSI) design process, designers specify obstacles 115, also referred to as keep out regions or KORs, along with terminals 105, 106, 107 and nets. For a conventional routing process, design rules specify that wires (and other layout objects) should be separated from obstacles by a specified distance that may be particular to the obstacle and/or object. The obstacles may include anything from a small discrete object to a functional block, for example, but may be any area that the designer wants to be avoided during a particular detail routing pass. An issue may arise when a wire is to be routed to a terminal 105, 106 or 107 that overlaps with the obstacle 115 or that is less than the specified distance from an obstacle.

A design rule-correct router may not route the wire because there may be no way to do so while maintaining the specified distance between the wire and the obstacle. A design rule-incorrect router will route the wires even if a new design rule violation (DRV) is created in the process as shown in FIG. 2.

For this example, regardless of the type of router used, additional post-processing may be involved. This post-processing may include, for example, manual routing of the wire, reviewing the routing in violation, and possibly re-routing the wire to ensure that issues such as notching and exfoliation, for example, are avoided. With the density and complexity of typical VLSI designs, such issues may arise frequently causing this post-processing step to be time consuming.

A somewhat similar issue may arise when routing a multi-terminal net as illustrated in FIG. 3. For example, a first wire 305 in a multi-terminal net has been routed between two terminals of the net. A second wire of the multi-terminal net is to be routed from a next terminal T1 to a specified terminal T2 on the first wire 305. If the first wire 305 is not considered to be an obstacle, the router may choose any route to the terminal T2 without observing any design rule spacings with respect to the wire 305.

If on, the other hand, the first wire 305 is considered an obstacle when the second wire is being routed, a design rule correct router will not complete the routing pass. A design rule-incorrect router will introduce a new design rule violation when connecting the second wire to the first wire because the second wire cannot be connected to the specified terminal T2 without violating design rule spacings with respect to the first wire 305. The routing causing the design rule violation may be acceptable, or, as shown in FIG. 4, it may be problematic.

Whenever a new design rule is introduced, additional processing, whether manual or automatic, may be involved as mentioned above. Such additional processing adds time and expense to the design process. Thus, it is desirable to avoid introducing new design rule violations whenever possible.

SUMMARY OF THE INVENTION

A method and apparatus for detail routing using obstacle carving around terminals are described.

In accordance with one embodiment, a method includes identifying a terminal in an integrated circuit layout object that is separated from an obstacle by less than a design rule spacing, and carving the obstacle to reduce an area of the obstacle by an overlap between the obstacle and the terminal bloated by the spacing.

Other features and advantages of the present invention will be appreciated from the accompanying drawings and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for detail routing using obstacle carving around terminals are described. In the following description, particular obstacle, wire and terminal configurations are described for purposes of illustration. It will be appreciated, however, that other embodiments are applicable to other configurations.

Figure 5:
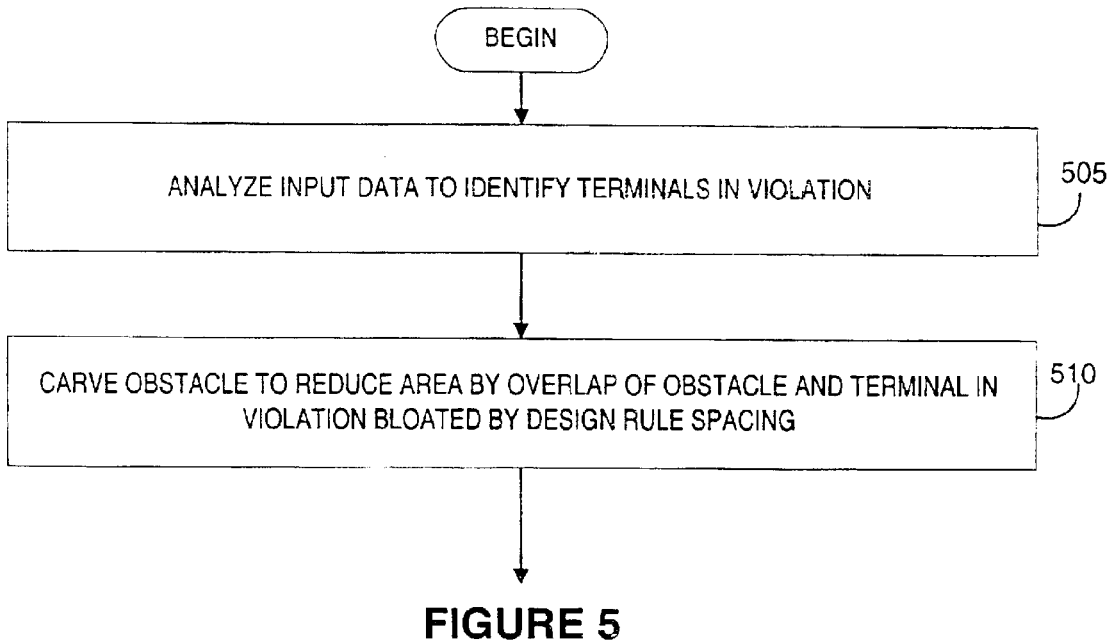
FIG. 5 is a flow diagram showing a method of one embodiment for pre-processing input data to a detail routing process to develop a detail routing model.

For one embodiment, as shown in FIG. 5, at block 505, input data to a detail routing process for an integrated circuit is analyzed to identify any terminals that 1) overlap with one or more obstacles and/or 2) are less than a specified distance away from one or more obstacles, wherein the distance may be specified by design rules, for example. Such terminals are referred to herein as terminals in violation. The obstacle(s) is then carved to reduce the area of the obstacle by the overlap of the obstacle and the terminal in violation bloated by the specified distance at block 510.

The terminal area may be referred to herein as a first-class citizen terminal while the area carved from the obstacle that is beyond the terminal area is referred to as a second-class citizen terminal.

Figure 6:
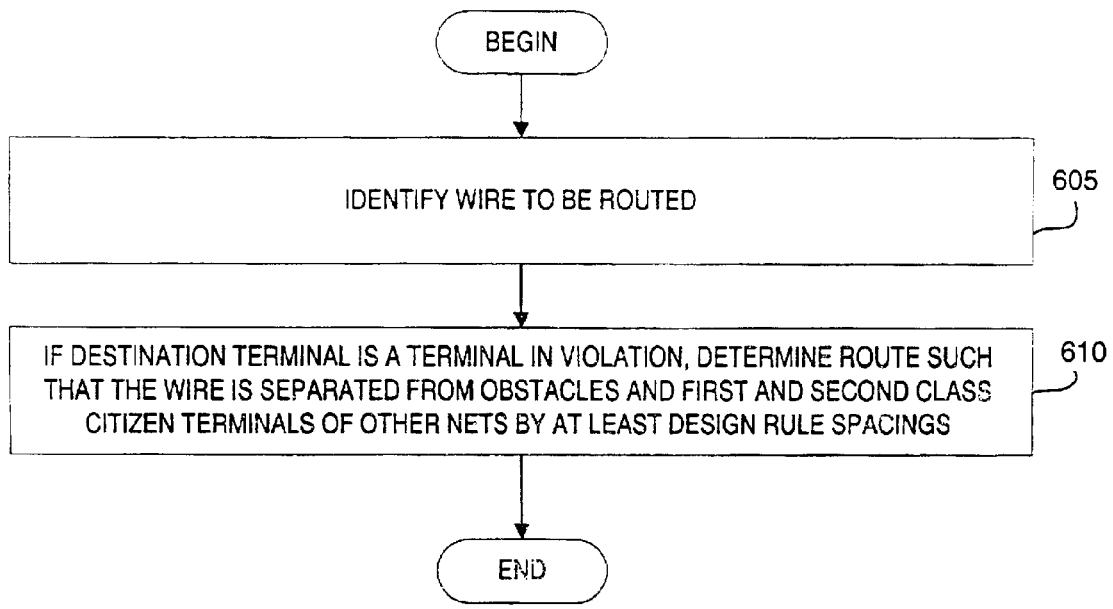
FIG. 6 is a flow diagram showing a method of one embodiment for routing a wire using the model developed according to FIG. 5.

In accordance with one embodiment, as shown in FIG. 6, a wire to be routed is identified at block 605. When a wire from a first net is specified to be routed to a given first-class citizen terminal (i.e. a terminal that was previously identified as a terminal in violation), the route for the wire is determined at block 610 such that the wire is separated from obstacles and first- and second-class citizens of other nets by at least the distance(s) specified in the design rules. The wire may touch, plow through or come within design rule specified distances of second-class citizen terminals that are associated with the first net. In this manner, wires may be connected to terminals in violation during detail routing without introducing new design rule violations.

Additional details of the above embodiments, as well as alternative embodiments are described below.

Figure 7:
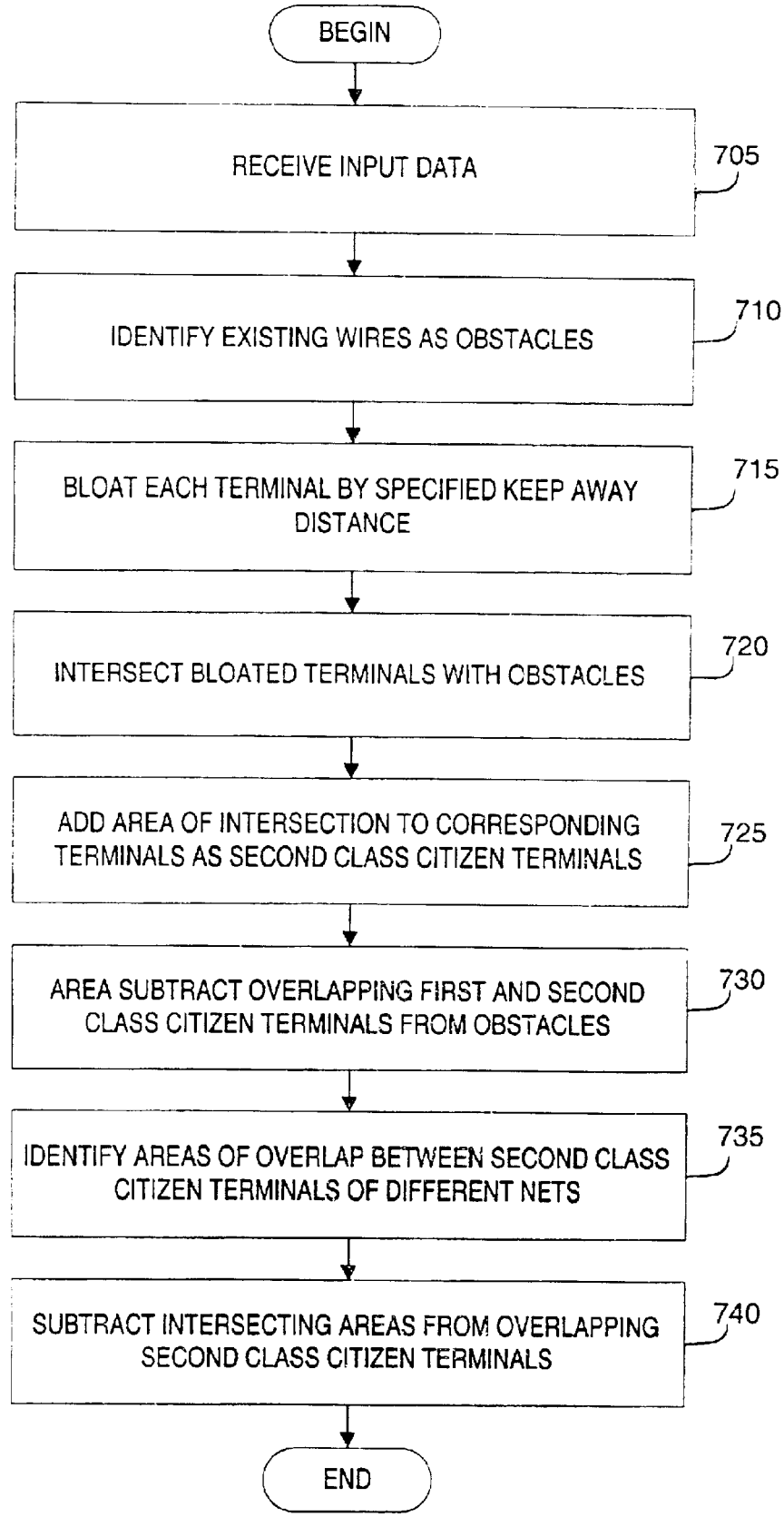
FIG. 7 is a flow diagram showing a method of an alternative embodiment for pre-processing input data to a detail routing process to develop a model.

FIG. 7 is a flow diagram showing a method of one embodiment for pre-processing input data to create a detail routing model for use in a detail routing process as described in more detail below.

At block 705, input data to the detail routing process is received. The input data may be in the form of a partial layout, including floorplan and global route information, along with design rules and a netlist that specifies the wires to be routed and the nets to which they correspond. The input data may specify, for example, locations of obstacles, terminals, existing wires that have been previously routed, and other physical elements that make up an integrated circuit chip. For one embodiment, the locations of objects are specified using X-Y coordinates relative to one corner of the integrated circuit chip layout and a Z coordinate to indicate the particular metal layer. Other approaches to specifying locations of elements are within the scope of various embodiments.

Figure 1:
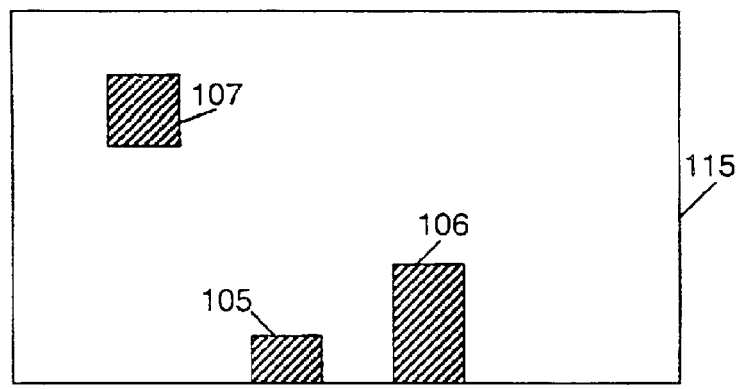
FIG. 1 is a plan view of a portion of an integrated circuit device layout including an obstacle and terminals in violation.
Figure 2:
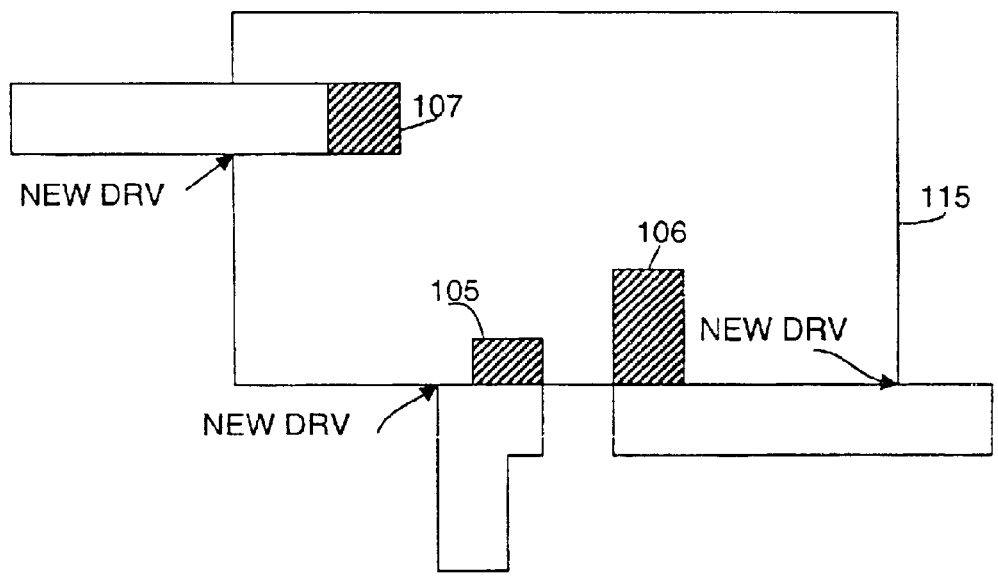
FIG. 2 is a plan view of one possibility for the layout of FIG. 1 after a detail routing pass using a conventional router.
Figure 3:
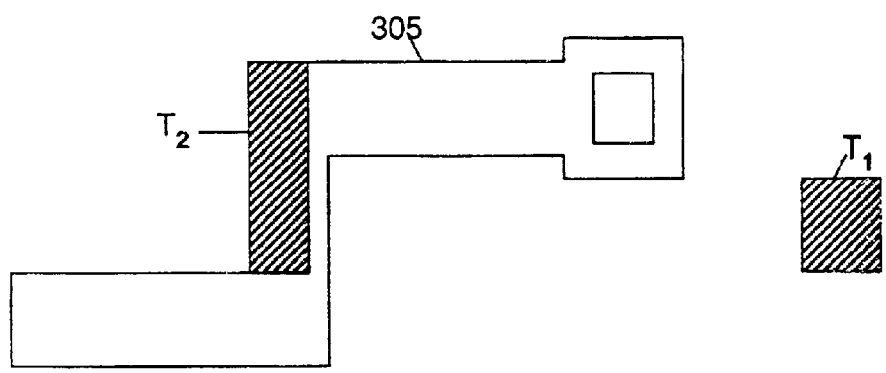
FIG. 3 is a plan view of a pre-existing wire and two terminals in a multi-terminal net.
Figure 4:
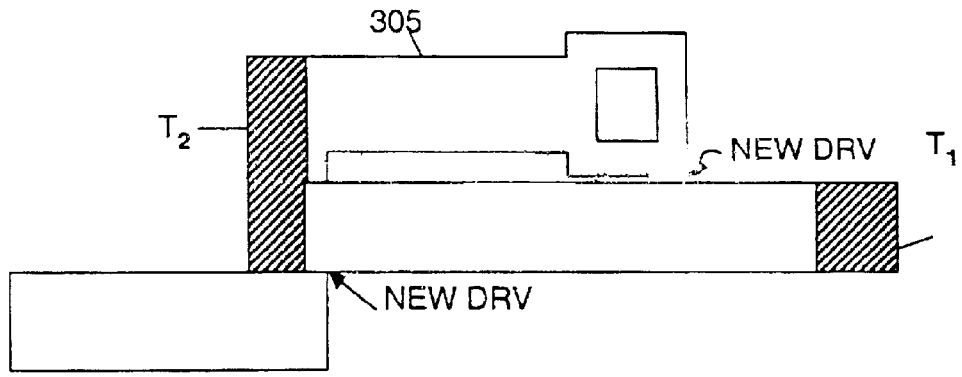
FIG. 4 is a plan view of one possibility for the layout of FIG. 3 after a detail routing pass using a conventional router.
Figure 8:
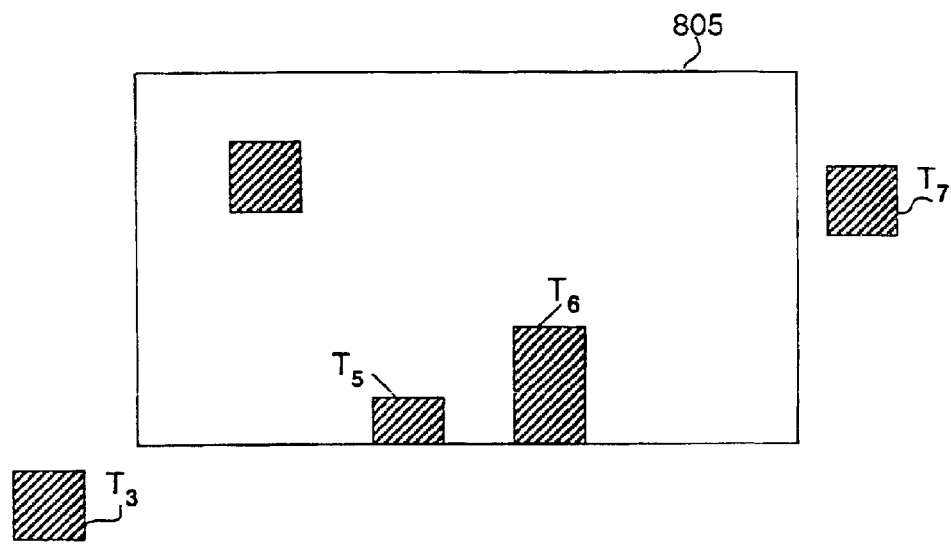
FIG. 8 is a plan view of an obstacle and terminals that may be included in a layout provided as input data to a detail routing process.

FIGS. 3 and 8 illustrate examples of structures that may be specified by such input data. These structures may both be included on a single integrated circuit chip or on different integrated circuit chips. FIG. 3, as described above, illustrates a pre-existing wire 305 that includes a specified terminal T2 to which another wire of the same net is to be connected. FIG. 8 shows an example of an obstacle 805 and terminals T3–T7. In the present description, terminals indicate a destination and/or origination point for one or more wires in an integrated circuit layout.

Additional information such as, for example, timing files and/or estimation files that may be used to determine cost functions, may also be received as input to the detail routing process, but are not necessarily used to create the detail routing model.

Referring back to FIG. 7, at block 710, pre-existing wires are temporarily identified as obstacles. For example, the pre-existing wire 305 of FIG. 3 is identified as an obstacle in the search model at block 710.

Figure 9:
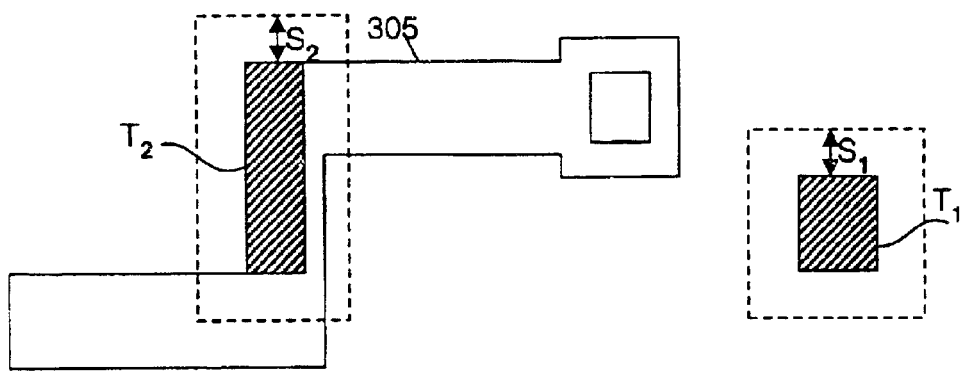
FIG. 9 is plan view of the wire and terminals of FIG. 3 after the terminals have been bloated.
Figure 10:
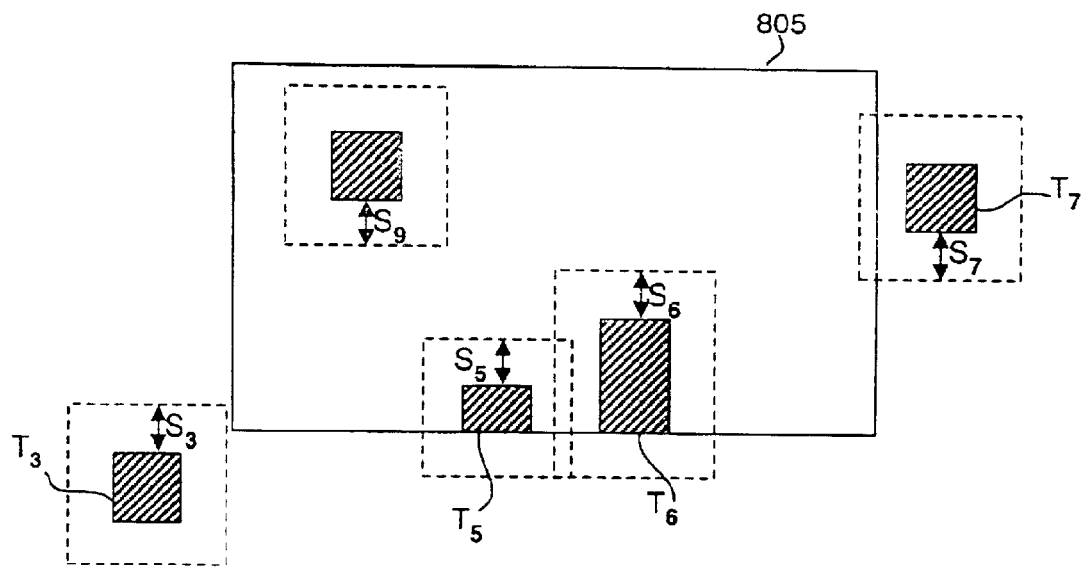
FIG. 10 is a plan view of the obstacle and terminals of FIG. 8 after the terminals have been bloated.

At block 715, each terminal in the input model (i.e. layout object) is bloated on all sides by a specified keep away distance or spacing S corresponding to the terminal. The terminals T1 and T2 of FIG. 3, for example, are expanded as indicated in FIG. 9 by the broken lines surrounding the terminals 315 and 310. Similarly, the terminals T3–T7 of FIG. 8 are expanded as indicated by the broken lines of FIG. 10. For one embodiment, this expansion may be performed using the X-Y coordinates of the terminals and the corresponding spacing Sx to determine X-Y coordinates of the bloated terminals.

For one embodiment, the amount by which each terminal is expanded (i.e. the spacing S corresponding to the terminal) may differ depending on the particular terminal. Considerations that may determine the spacing for a particular terminal include, for example, characteristics of nearby structures, the size and function of wire(s) to be coupled to the terminal, etc. For one embodiment, the spacing S corresponding to each terminal is specified in the design rules received along with the input data and/or is determined based on design rule spacing associated with a nearby obstacle or a wire to be coupled to the terminal.

With continuing reference to FIG. 7, at block 720, bloated terminals are intersected with obstacles to identify areas of overlap. For one embodiment, a corner-stitched data structure is used to perform the intersection such that a number of comparisons with surrounding structures may be reduced as compared to some other approaches. An example of a corner-stitched data structure is described in J. K. Ousterhout, "Corner stitching: A data structuring technique for VLSI layout tools" IEEE Trans. Computer-Aided Design, vol. CAD-3, 1984. For other embodiments, a different approach to intersecting the bloated terminals with the obstacles may be used, such as comparing the coordinates of each terminal with coordinate of each obstacle.

Once the area(s) of intersection between obstacles and bloated terminals have been identified, at block 725, the area(s) are added to the corresponding terminals. As mentioned above, the added areas are referred to herein as second-class citizen terminals while the original terminals associated with second-class citizen terminals are referred to herein as first-class citizen terminals. For one embodiment, the expanded areas that do not overlap with an obstacle are ignored.

Figure 18:
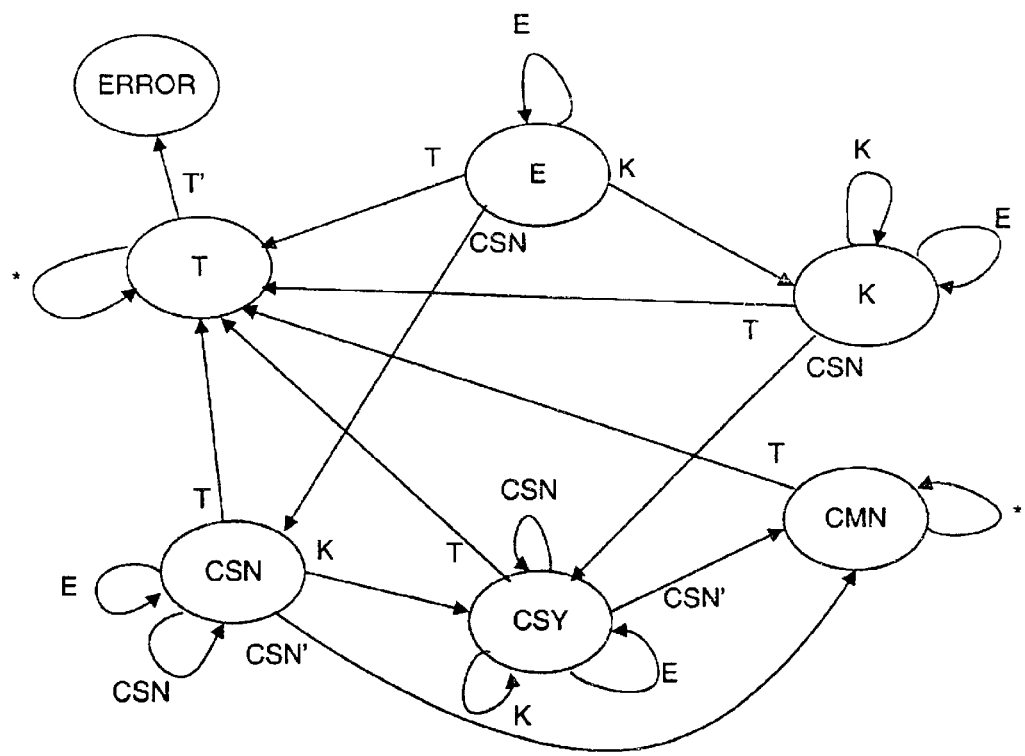
FIG. 18 is a state diagram showing an approach of one embodiment for identifying second class citizen terminals.

One approach to intersecting bloated terminals and identifying second-class citizen terminals is illustrated in the state diagram of FIG. 18. For the approach of FIG. 18, the integrated circuit layout (also referred to as a layout object) is specified in terms of rectangles in a manner well-known to those of ordinary skill in the art. In accordance with the embodiment of FIG. 19, each rectangle may correspond to one of four objects: 1) empty space (E), 2) an obstacle (also referred to as a KOR) (K), 3) a terminal (T), or 4) the area by which the terminal has been bloated (CSN). Each terminal (T) and area by which the terminal has been bloated (CSN) is also identified as being associated with a particular net.

Figure 19:
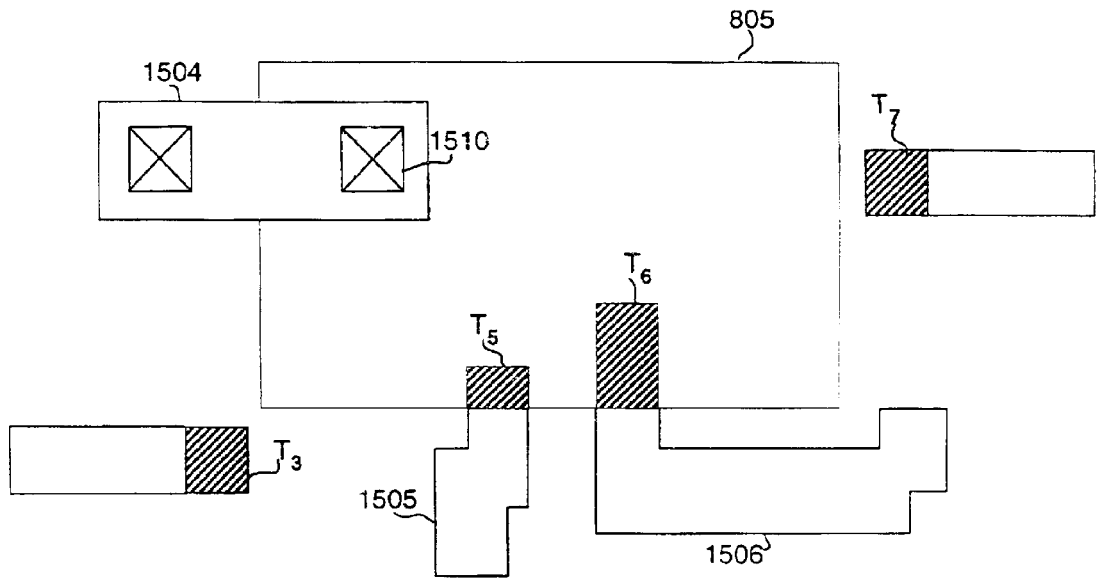
FIG. 19 is a plan view of the obstacle and terminals of FIG. 8 showing exemplary wires to be routed to the terminals according to the flow of FIG. 14 and illustrating their spacing from first- and second-class citizen terminals of other nets.

The state diagram starts at the state E. If the next overlapping rectangle in the layout is empty space (E), there is no change. If, however, the next overlapping rectangle is a terminal (T), an obstacle (K) or a bloated area beyond a terminal (CSN), there is a transition to the corresponding state as shown in FIG. 19.

If the rectangle was a T, then at the state T, if an overlapping T from another net (T') is received, there is an error since terminals from different nets should not overlap. If any other type of object is received (as indicated by the *), the rectangle remains a terminal.

If instead the overlapping rectangle received while in the state E is a CSN, then if an overlapping terminal T is received, the overlapping terminal T is identified as a terminal. If an overlapping E or CSN is received, the CSN remains a CSN. If an overlapping K is received, the overlapping rectangle is identified as a second-class citizen terminal (CSY) and if an overlapping CSN from another net (CSN') is received, then a carving, multiple coverage object is indicated (CMN). The carving multiple coverage object indicates an overlap between two second-class citizen terminals that is basically indicated as empty space in the resulting data structure as described in more detail below.

Referring back to the E state, if the overlapping rectangle was a K, then at the K state, another overlapping K or E remains a K. An overlapping CSN indicates a CSY (a transition to the CSY state), while an overlapping T is identified as a T.

At the CSY state, an overlapping CSN, K or K is a CSY. An overlapping T is a T and an overlapping CSN from another net (CSN') is a CMN. Rectangles that are identified as CSYs are written back to the detail routing model as second-class citizen terminals.

At the CMN state, an overlapping T causes a transition to the T state while any other type of overlapping rectangle remains a CMN.

In the above manner, second-class citizen terminals may be efficiently identified from a layout object while only evaluating each rectangle one time for one embodiment. Other approaches for identifying second-class citizen terminals are within the scope of various embodiments.

Figure 11:
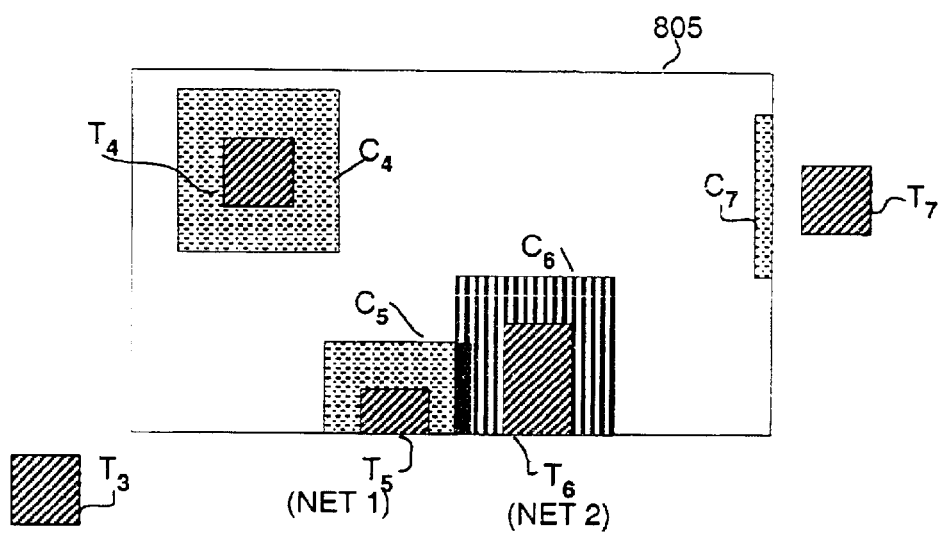
FIG. 11 is a plan view of the obstacle and terminals of FIG. 8 after second-class citizen terminals have been created and carved from the obstacle.
Figure 12:
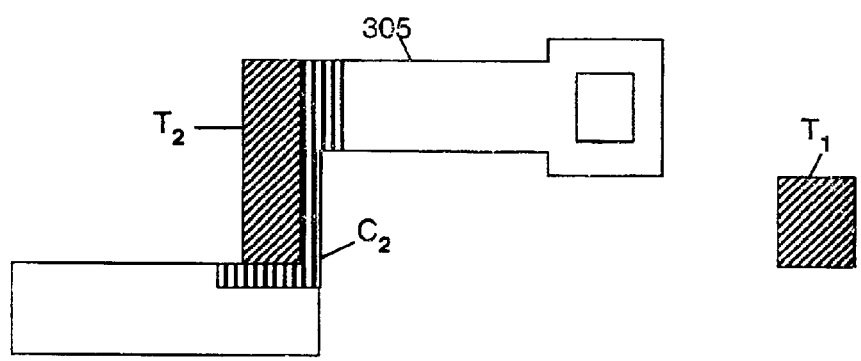
FIG. 12 is a plan view of the wire and terminals of FIG. 3 after a second-class citizen terminal has been created and carved from the wire (obstacle).

FIG. 11 shows the second-class citizen terminals C4–C7 corresponding to first-class citizen terminals T4–T7, while FIG. 12 shows the second-class citizen terminal C2 corresponding to the first-class citizen terminal T2. For one embodiment, the areas of the second-class citizen terminals are indicated in the detail routing model by X-Y coordinates of the corners of the second-class citizen terminals and, in some cases, a Z coordinate to indicate the particular metal layer.

Referring back to FIG. 7, at block 730, first- and second-class citizen terminals are area-subtracted or carved from the overlapping obstacle such that the area of the obstacle is reduced. This operation may be performed for one embodiment using X-Y coordinates identifying the obstacle and first- and second-class citizen terminals. Other approaches may be used for other embodiments.

For one embodiment, the input data indicates for each terminal the net to which it belongs. As second-class citizen terminals are defined at block 725, they are identified with the same net as their corresponding first-class citizen terminals. At block 735, areas of overlap between second-class citizen terminals of different nets are identified.

Referring to FIG. 11, for example, first-class citizen terminal T5 may belong to NET1 while first-class citizen terminal T6 is associated with NET2. For this example, second-class citizen terminals C5 and C6 are associated with different nets and overlap. Thus, C5 and C6 would be identified at block 735.

Figure 13:
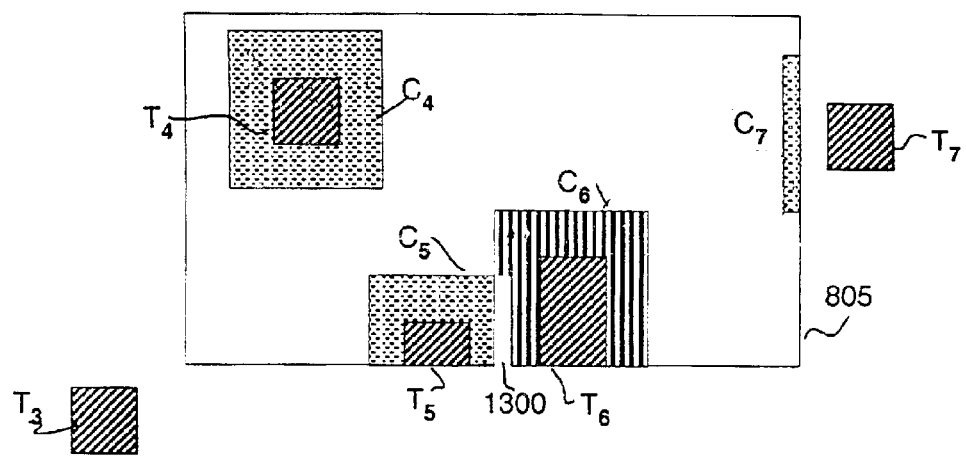
FIG. 13 is a plan view of the obstacle and terminals of FIG. 8 after the area of overlap between second-class citizen terminals of different nets has been subtracted.

At block 740, the area of overlap between second-class citizen terminals of different nets is subtracted from both of the overlapping second-class citizen terminals. Thus, for the above example, the area of overlap between the second-class citizen terminals C5 and C6 is area subtracted from both second-class citizen terminals as shown in FIG. 13. If more than two second-class citizen terminals overlap, the overlapping area is subtracted from each of the overlapping second-class citizen terminals. The subtracted area 1300 is not part of the obstacle 805 or a first or second-class citizen terminal, and is effectively considered to be open space or air for routing purposes. The method of this embodiment then ends at block 750 with the output of the method being a detail routing model. The detail routing model of some embodiments is a three dimensional model that includes multiple metal layers.

For one embodiment, various areas of the resulting detail routing model are identified during this pre-processing phase as being associated with different "colors" or levels of constraints with respect to routing. For example, obstacles that should be separated from all wires by a predetermined spacing may be black, while second-class citizen terminals that may only require spacing from wires of other nets may be gray, and open areas may be white. An example of such an approach is described in a copending patent application filed concurrently herewith entitled "Accurate Layout Modeling for Center-Line Based Detail Routing," Ser. No. 09/473282 that is assigned to the assignee of the present invention.

It will be appreciated that other approaches to identifying the different types of areas and different routing constraints are within the scope of various embodiments.

Figure 14:
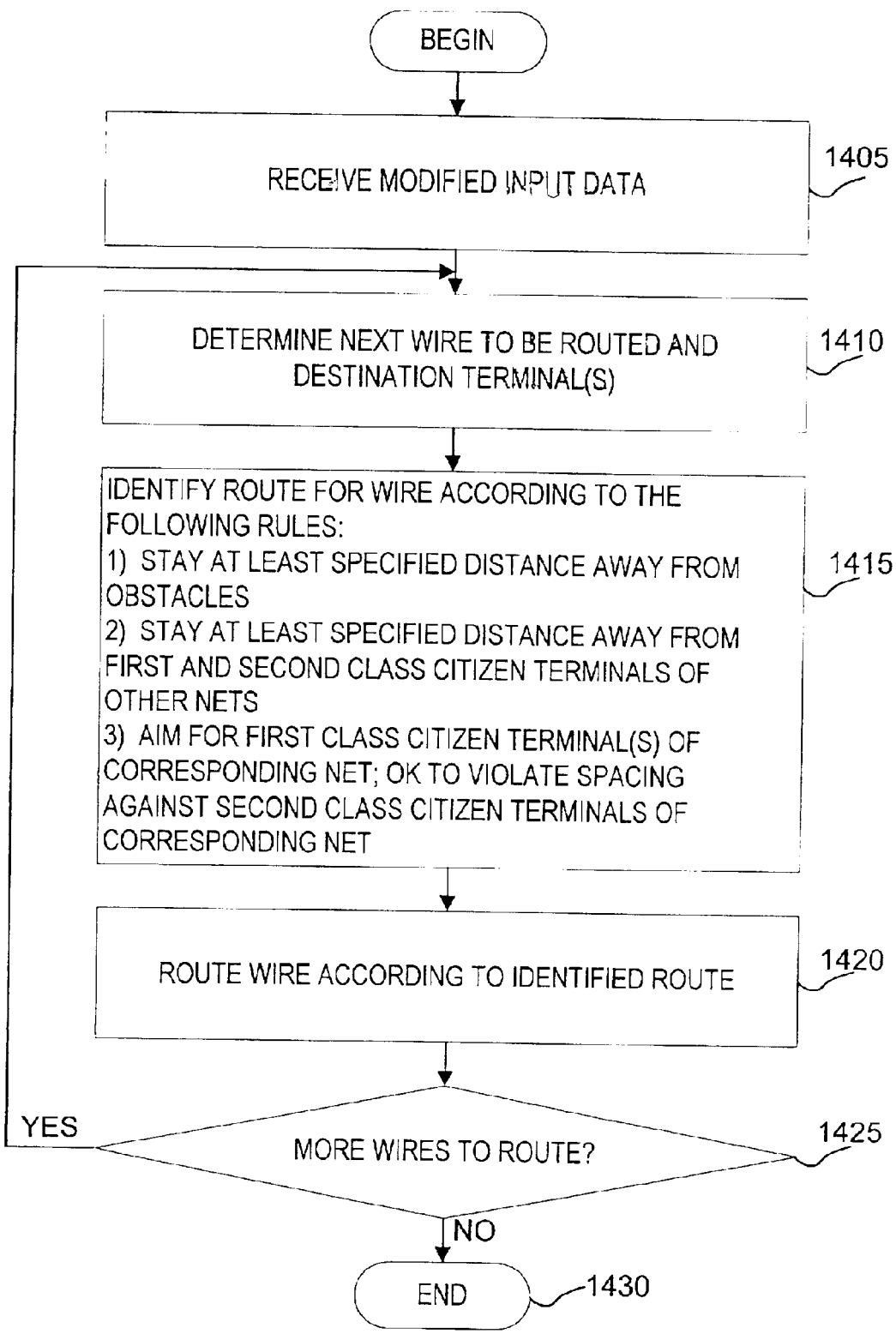
FIG. 14 is a flow diagram illustrating the method of one embodiment for routing one or more wires using the model created according to the flow indicated in FIG. 7.

Once the detail routing model has been developed as described above, the router of one embodiment can begin to search the model to determine a desirable route for a wire to be routed. FIG. 14 is a flow diagram illustrating a method for routing one or more wires using the detail router of one embodiment.

At block 1405, the modified input data (i.e. the detail routing model) is received or otherwise provided to the searching portion of the detail router. At block 1410, the router determines the next wire to be routed and the destination terminal to which it is to be connected. This information may be supplied, for example, as part of the netlist input data. The input data also indicates the net to which the wire belongs. Wires may be routed net by net or area by area, for example. Other orders for routing wires may be used in accordance with other embodiments.

At block 1415, the detail router of one embodiment identifies a route for the selected wire according to the following rules: 1) the wire should stay at least a first specified distance away from obstacles, 2) the wire should stay at least a second specified distance away from first- and second-class citizen terminals of different nets, and 3) the wire should aim for first-class citizen terminal(s) of the corresponding net. While following the above rules, the wire does not need to observe any spacing considerations with respect to second-class citizen terminals corresponding to the same net as the wire.

The first and second specified distances may be specified by the design rules and may be the same or different from each other. The first specified distance may correspond to a spacing requirement associated with the obstacle, the wire to be routed or a compromise between the two requirements. Similarly, the second specified distance may be determined according to a spacing requirement associated with the terminal(s) of other nets and/or with the wire itself. The manner in which the particular spacing requirements are determined may be a matter of preference for the designers of a particular integrated circuit chip.

For one embodiment, the detail router search methodology uses colors as described above to recognize the different spacing constraints associated with different elements in the detail routing model as described in the copending patent application mentioned above. Other approaches to indicating and observing the above constraints are within the scope of various embodiments.

Other aspects of the detail router search methodology may be similar to currently available routers for one embodiment. For example, the detail router may be a maze router that searches for available routes in a well-known manner, but, unlike conventional maze routers, performs the search according to the above constraints.

For one embodiment the detail router is a design rule-correct detail router such that, at block 1415, if it is not possible to identify a route for the selected wire that meets the above rules, the router will not complete the route and the method will end.

With continuing reference to FIG. 14, at block 1420, once a route for the wire of interest has been determined at block 1415, the wire is routed according to the identified route.

The route of the wire for one embodiment may be identified by X, Y and Z coordinates corresponding to starting and ending points of the route as well as points at which the route changes directions. For an alternative embodiment, the wire route may be specified by a combination of coordinates and track numbers that indicate particular routing paths in the layout. The routing is basically a three dimensional tree structure where the X and Y edges represent wires and the Z-axis identifies via(s).

Figure 15:
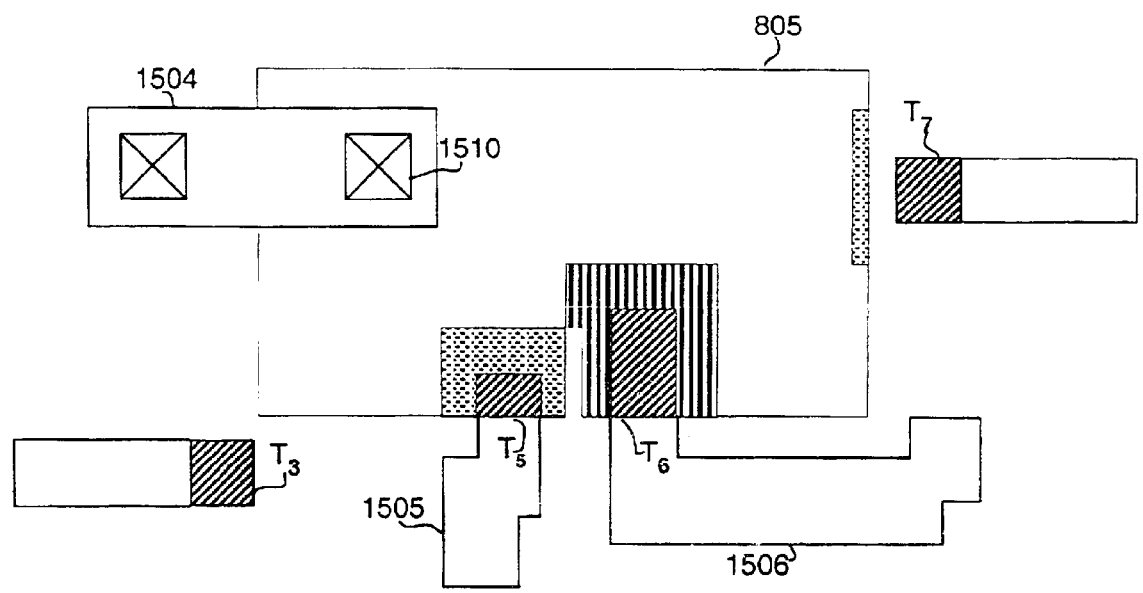
FIG. 15 is a plan view of the obstacle and terminals of FIG. 8 after exemplary wires have been routed to the terminals according to the flow of FIG. 14.

FIGS. 19 and 15 shows some exemplary wires that might be routed by the detail router in accordance with the above-described embodiments. In particular, note, for example, that the wire 1506 is routed such that at all points it is spaced by at least S6 from the obstacle 805 and the second-class citizen terminal C5 that corresponds to another net. Since it was not possible to route the wire 1504 to the terminal T4 on the same layer as the terminal T4 without violating the obstacle spacing constraint, the wire 1504 is routed by the detail router of one embodiment on a layer above the terminal T4. The wire 1504 is connected to the terminal T4 by a via 1510. In this manner, the wire 1504 and the via 1510 meet all of the constraints of the router and do not introduce any new design rule violations.

Figure 16:
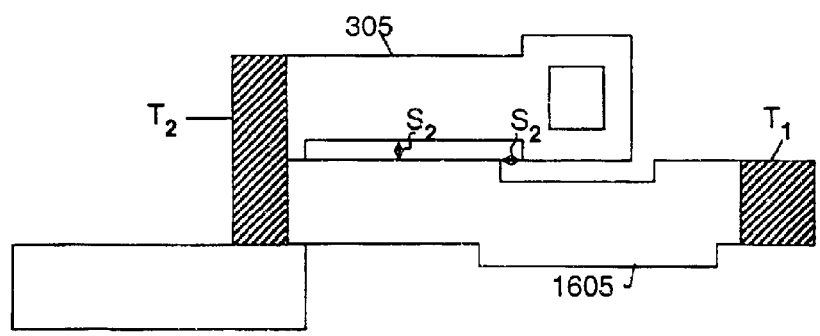
FIG. 16 is a plan view of the wire and terminals of FIG. 3 after an exemplary wire has been routed to the terminal in violation according to the flow of FIG. 14.

FIG. 16 shows an example of a routing for a wire 1605 between the terminals T1 and T2 of a multi-terminal net. In this example, as in the example above, the spacing S2 is maintained between the wire 1605 and the pre-existing wire 305 at all points while connecting the wire to the desired terminal T2. Again, no new design rule violations are introduced with this routing.

For one embodiment, a divide and conquer approach is used such that only a portion of the input data is modeled and/or routed during a particular modeling or routing pass. The integrated circuit chip may be divided into various different areas using a grid, for example, and the input data corresponding to one area at a time is modeled and then detail routing is performed. For other embodiments, it may be possible to model and/or perform detail routing for the entire integrated circuit chip in a single pass in the manner described above.

Second-class citizen terminals and carved out obstacles are not included in the final layout that is produced as a result of completing the detail routing process. The layout is used to develop the mask set that is used to manufacture the corresponding integrated circuit device. Thus, the resulting integrated circuit device includes wires with routes that have been determined in the above-described manner.

Figure 17:
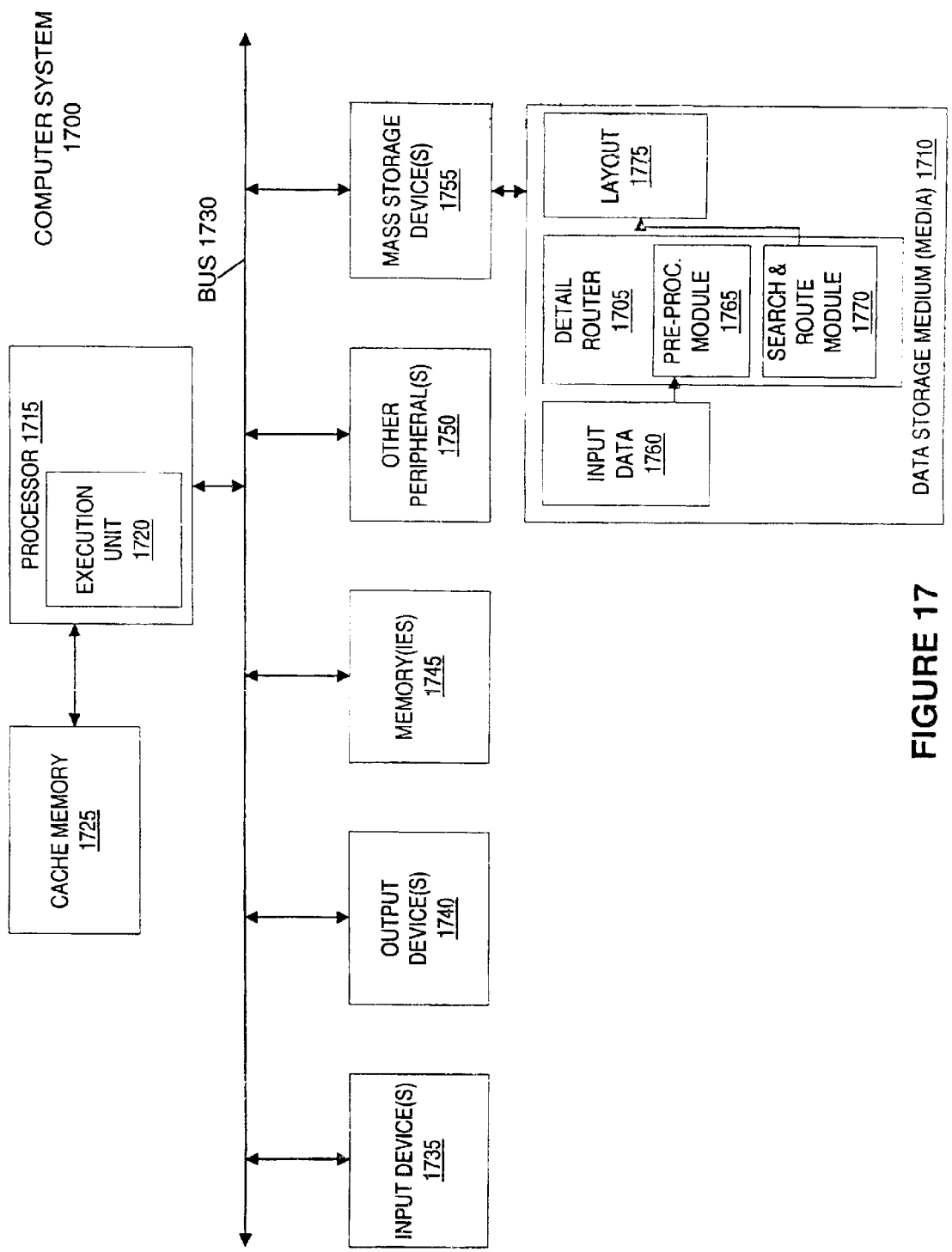
FIG. 17 is a block diagram of a computer system that may be used to execute a detail routing program in accordance with one embodiment.

The detail router of one embodiment may be implemented in software 1705 that is stored on one or more computer-readable storage media 1710 and executed by a computer system such as the computer system 1700 of FIG. 17. The computer system 1700 may be a workstation computer system such as, for example, a Hewlett Packard HP 9000 Enterprise Server manufactured by Hewlett Packard Company of Palo Alto, Calif. Other types of workstations and/or other types of computer systems configured in a different manner are within the scope of various embodiments.

The computer system 1700 includes a processor 1715 that executes instructions using an execution unit 1720. A cache memory 1725 may be coupled to the processor 1715 to store recently and/or frequently used instructions. The processor 1715 is coupled to a bus 1730 to communicate information between the processor 1715 and other components in the computer system 1700.

Also coupled to the bus 1730 are one or more input devices 1735, such as a keyboard and/or a cursor control device, one or more output devices 1740, such as a monitor and/or printer, one or more memories 1745 (e.g. random access memory (RAM), read only memory (ROM), etc.), other peripherals 1750 (e.g. memory controller, graphics controller, bus bridge, etc.), and one or more mass storage devices 1755.

The mass storage device(s) 1755 may include a hard disk drive, a compact disc read only memory (CD ROM) drive and/or an optical disk drive, for example. Further, the mass storage device(s) 1755 may include additional mass storage device(s) that are accessible by the computer system 1700 over a network (not shown).

The corresponding computer-readable storage medium (or media) 1710 (also referred to simply as a data storage medium) may be used to store instructions, data and/or one or more programs to be executed by the processor 1715 including, for example the detail router 1705 and input data 1760 to be received by the detail router 1705. The detail router 1705 may include a pre-processing module 1765 that operates in accordance with one or more of the above-described embodiments to develop a detail routing model in response to receiving the input data 1760. The detail router may also include a search and route module 1770 that receives the detail routing model from the pre-processing module 1765 and determines in accordance with one of the above-described embodiments, routes for wires destined for a terminal in violation.

Upon completion of the detail routing process (or a particular detail routing pass), a layout 1775 is provided as output from the detail router 1705.

It will be appreciated that, while the programs and information described above are shown as being stored on and/or executed from a storage medium on a single computer system, multiple computer systems may be used to execute one or more of the programs 1705 and/or to store the data.

The detail router of the above-described embodiments is advantageous in that wires may be routed to terminals in violation without introducing new design rule violations. In this manner, the detail router of some embodiments may reduce the amount of post-processing that is required after a given detail routing pass. Further, the detail router of some embodiments may help to more intelligently determine wire routes to terminals in violation in some cases without using a manual routing process.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method comprising:
    carving an obstacle to reduce its area by an amount equal to an overlap between the obstacle and a first terminal bloated by a design rule spacing; and
    determining a route for a wire to be connected to the first terminal such that the wire is separated from the carved obstacle at all points along the wire by at least the design rule spacing.
2. The method of claim 1 further comprising:
    identifying an area of the bloated first terminal beyond the first terminal as a second-class citizen terminal wherein the first terminal, the wire and the second-class citizen terminal are each associated with a first net, and
    wherein the route for the wire is further determined such that the wire is also separated from second-class citizen terminals of other nets by at least the design rule spacing.
3. The method of claim 2 further comprising:
    subtracting an area of overlap between second-class citizen terminals of different nets from the overlapping second-class citizen terminals.
4. The method of claim 1 further comprising:
    identifying a pre-existing wire as an obstacle.
5. A detail router comprising:
    a pre-processing module to carve obstacles indicated by input data to reduce an area of the obstacles by an overlap between the obstacles and one or more terminals in violation bloated by a design rule spacing; and
    a search and route module to identify a route for a first wire of a first net to be coupled to a first terminal of the terminals in violation, the search and route module to identify the route such that the first wire is separated from obstacles at all points along the wire by at least the design rule spacing.
6. The detail router of claim 5 wherein the pre-processing module is further to identify an area of the bloated terminals beyond the terminals in violation as second-class citizen terminals, the terminals in violation and the second-class citizen terminals each corresponding to a particular net, and
    wherein the search and route module is further to identify the route such that the first wire is also separated from second-class citizens corresponding to nets other than the first net by at least the design rule spacing.
7. The detail router of claim 5 wherein the pre-processing module is further to identify pre-existing wires as obstacles.
8. A computer-readable storage medium to store instructions which, when executed cause a computer system to perform a method comprising:
    identifying a terminal in an integrated circuit layout object that is separated from an obstacle by less than a spacing specified by a design rule, and
    carving the obstacle to reduce an area of the obstacle by an overlap between the obstacle and the terminal bloated by the spacing.
9. The computer-readable storage medium of claim 8 further storing instructions which, when executed cause a computer system to perform the method further comprising:
    bloating the terminal by the spacing,
    intersecting the bloated terminal with the obstacle, and
    adding an area of intersection between the bloated terminal and the obstacle to the terminal as a second-class citizen terminal.
10. The computer-readable storage medium of claim 9 further storing instructions which, when executed cause a computer system to perform the method further comprising:
    identifying an area of overlap between the second-class citizen terminal and a second-class citizen terminal associated with a different net; and
    subtracting the area of overlap from both second-class citizen terminals.
11. The computer-readable storage medium of claim 9 wherein the terminal and the second-class citizen terminal correspond to a first net, the computer-readable storage medium further storing instructions which, when executed cause a computer system to perform the method further comprising:
    identifying a route for a wire of the first net to be coupled to the terminal such that the wire is spaced from the carved obstacle and second-class citizen terminals of other nets by at least the specified distance at all points along the wire.

12. The computer-readable storage medium of claim 8 further storing instructions which, when executed cause a computer system to perform the method further comprising:
identifying a route for a wire to be coupled to the terminal such that the wire is spaced from the carved obstacle by at least the specified distance at all points along the wire.

13. A computer-readable storage medium to store instructions which, when executed cause a computer system to perform a method comprising:
identifying a wire to be routed, the wire corresponding to a first net;
if a destination terminal for the wire is a terminal in violation, determining a route for the wire to be connected to the destination terminal such that the wire is separated at all points along the wire from obstacles and first- and second-class citizen terminals of other nets by at least a specified design rule spacing determined from a design rule associated with one of the obstacle or the wire; and constructing a detail routing model from input data, including
receiving input data that specifies at least the destination terminal and an obstacle that overlaps with the destination terminal;
identifying the destination terminal as a terminal in violation, and
carving the obstacle to reduce an area of the obstacle by an overlap between the obstacle and the terminal bloated by the specified design rule spacing,
wherein determining the route for the wire is performed using the detail routing model.

* * * * *